United States Patent [19]
Sato

[11] Patent Number: 5,788,764
[45] Date of Patent: Aug. 4, 1998

[54] KTP SOLID SOLUTION SINGLE CRYSTALS AND PROCESS FOR THE PRODUCTION THEREOF

[75] Inventor: Koji Sato, Tokyo, Japan

[73] Assignee: Hoya Corporation, Tokyo, Japan

[21] Appl. No.: 587,975

[22] Filed: Jan. 17, 1996

[30] Foreign Application Priority Data

Jan. 19, 1995 [JP] Japan ................................ 7-006310
Dec. 20, 1995 [JP] Japan ................................ 7-331588

[51] Int. Cl.$^6$ ........................... C30B 29/14; C30B 15/04
[52] U.S. Cl. ..................... 117/28; 117/33; 117/36; 117/941
[58] Field of Search ..................... 117/33, 28, 36, 117/941

[56] References Cited

U.S. PATENT DOCUMENTS

| | | | |
|---|---|---|---|
| 5,146,533 | 9/1992 | Bierlien et al. | 117/941 |
| 5,334,365 | 8/1994 | Cheng | 117/36 |
| 5,370,076 | 12/1994 | Okamoto et al. | 117/36 |

FOREIGN PATENT DOCUMENTS

| | | | |
|---|---|---|---|
| 466260 | 1/1982 | European Pat. Off. | 117/941 |
| 3-65597 | 3/1991 | Japan | 117/36 |
| 5-279186 | 10/1993 | Japan | 117/36 |
| 6-64995 | 3/1994 | Japan | 117/36 |

OTHER PUBLICATIONS

P.A. Morris et al., Journal of Crystal Growth 109, "Reduction of the ionic conductivity of flux growth $KTiOPO_4$ crystals",1991, pp. 367–375.

G.M. Loiacono et al., Appl. Phys. Lett. 64(1), "Modified $KTiOPO_4$ crystals for noncritical phase matching applications", 1994, pp.16–17.

L.T. Cheng et al., Appl. Phys. Lett. 64(2), "Blue light generation using bulk single crystals of niobium–doped $KTiOPO_4$ ", 1994, pp. 155–157.

*Primary Examiner*—Robert Kunemund
*Attorney, Agent, or Firm*—Burns, Doane, Swecker & Mathis, L.L.P.

[57] ABSTRACT

Disclosed are a process for the production of solid solution single crystals of $KTiOPO_4$ wherein a part or all of at least one of the elements, K, Ti and P is substituted with one or more other elements, which comprises moving a grown part(s) of crystal(s) to outside of a melt for the crystal growth while maintaining contact of a growing part(s) of the crystal (s) with said melt to obtain the above solid solution single crystals, wherein the moving is carried out while maintaining the temperature of the melt substantially constant and maintaining said melt at a substantially constant composition at which the solid solution single crystal(s) with the desired composition is precipitated at the above maintained temperature and a solid solution single crystal of KTiOPO4 wherein a part or all of at least one of the elements, K, Ti and P is substituted with one or more other elements and its composition is substantially homogeneous within its cubic portions of a side length of 1 cm.

11 Claims, 5 Drawing Sheets

ANALYZED LOCATION OF (100) FACE SECTION

KTP SOLID SOLUTION SINGLE CRYSTALS AND PROCESS FOR THE PRODUCTION THEREOF

BACKGROUND OF THE INVENTION

1. Field of the Invention

The present invention relates to a solid solution single crystal of $KTiOPO_4$ having a homogeneous composition wherein a part or all of at least one of the elements, K, Ti and P is substituted with one or more other elements and to a process for the production thereof.

More precisely, the solid solution crystal of the present invention can be obtained in relatively large size while having a homogeneous composition. Thus it is easy to prepare optoelectronic devices exhibiting controlled physical properties from the above crystal and the yield of the devices from the crystal is markedly improved.

2. Related Art

Single crystals obtained by substituting a part of elements of $KTiOPO_4$ (hereinafter "KTP") with other elements have been paid much attention since these materials are capable of improving characteristics of KTP.

For example, it was reported that ion conductivity of KTP can be lowered by substituting a part of $Ti^{4+}$ of KTP with $Al^{3+}$ or $Ga^{3+}$ (Morris, Bierlein et al., J. C. G., 1991).

It was also reported that when KTP is used for SHG (second harmonic generation) devices or optical modulation devices transmission rate may be improved by doping it with $Ce^{4+}$ (Crystal Technology Ltd., U.S.A., 1992).

Further, there has been several examples of solid solution single crystals utilized in SHG by the noncritical phase-matching (NCPM).

For example, Du Pont Ltd. achieved SHG at 1.36 μm by $K_{1-x}Cs_xTiOPO_4$ and SHG at 1.06 μm by $KTiOP_{1-x}As_xO_4$ (CLEO, '93).

It has been also reported that cutoff of SHG may be sifted from 994 nm to 981 nm by varying the value x of $K_{1-x}Na_xTiOPO_4$ (Loiacono, Appl. Phys. Lett. 64(1), 1994).

Furthermore, Cheng, Bierlain et al. achieved SHG at 0.89 to 1.08 μm by solid solutions of $K_{1-x}Nb_xTi_{1-x}OPO_4$ and $K_{1-x}Ta_xOPO_4$. In addition, they predicted observations of SHG at 0.473; 0.532 and 0.660 μm by $Rb_{1-x}Cs_xTiOAsO_4$ (Appl. Phys. Lett. 64(2), 1994).

Although KTP solid solution single crystals show excellent properties as mentioned above, the growth of these crystals are technically difficult. The reported crystals could have been obtained hitherto only in a laboratory scale and had the sizes sufficient only for the purpose of investigating their physical properties. It is necessary to provide KTP solid solution single crystals with a homogeneous composition and a large size for practical applications. However, it has not been possible to produce such KTP solid solution single crystals by any conventional methods.

For example, a slow cooling method is generally utilized in the production of single crystals. In this method, crystallization is conducted by lowering gradually the temperature of a melt from which a single crystal is prepared. However, a composition of the resulting solid solution single crystal will be varied due to the sift of the temperature of the melt.

This will be explained in detail hereinafter by referring to a phase diagram.

FIG. 1 shows a typical phase diagram of solid solutions. When solid solutions are of $K_{1-x}Na_xTiOPO_4$, A represents K and B represents Na. The point of A on the abscissa axis corresponds to x=0 and the point of B corresponds to x=1. When crystals are grown at a temperature of t1, a solid phase of a composition S1 is crystallized from a liquid phase of a composition L1. Similarly, when crystals are grown at a temperature of t2, a solid phase of a composition S2 is crystallized from a liquid phase of a composition L2.

Therefore, when the temperature of the liquid phase is lowered from t1 to t2 by slow cooling, the composition of crystals S1 originally grown at t1 will be changed to S2 at the temperature of t2.

Appl. Phys. Lett. 64 (1), 1994, supra describes that $K_{1-x}Na_xTiOPO_4$ was produced by the slow cooling technique. Therefore, it is considered that the compositions of the crystals obtained in this literature were changed as they grew and only a part of the obtained crystals were used for the characterization of their properties.

Appl. Phys. Lett. 64 (2), 1994, supra describes only that the production methods of $K_{1-x}Nb_xTi_{1-x}OPO_4$ and $K_{1-x}Ta_xTi_{1-x}OPO_4$ are complex and will be presented elsewhere, and thus the production methods are unknown.

As described above, the compositions of melts will be changed with decrease of liquid phase temperature in conventional techniques for growing crystals based on the top seeded solution growth (TSSG) and thus it is impossible to produce large crystals with a constant x value. As the temperature is lowered, crystallization proceeds while changing compositions of crystals along the solidus line. Therefore, compositions of resulting grown crystals will be changed in a concentric manner (or like annual rings). Change of the element substitution ratio (x) will result in change of optical characteristics, electrical characteristics or the like of single crystals.

To obtain devices having constant physical properties, it is necessary to obtain crystals having a constant element substitution ratio (x). However, in such crystals with a heterogeneous composition as described above, characteristics will vary depending on the location where a device is cut out. Therefore, a portion having desired compositions, i.e., desired characteristics would be present only in a limited portion of one single crystal. This would be a serious problem for practical use since devices of constant characteristics cannot be obtained with a good yield from such a crystal.

As generally known methods for growing single crystals, there are the TSFZ (travelling solvent floating zone) method and the double-crucible method. However, it is difficult to obtain large crystals by the former method and the growing process of the same itself is technically difficult. Further, in the latter method, if the crystal growth rate is lower than a certain level, solutions and starting melts may be mixed to inhibit the crystal growth. Thus, it is difficult to produce such single crystals as intended by the present invention by those methods. In addition, those methods require steep temperature gradients for crystal growth and hence they are not inherently applicable for the growth of single crystals intended by the present invention.

Accordingly, an object of the present invention is to provide solid solution single crystals of $KTiOPO_4$ having a substantially homogeneous composition within the crystals wherein a part or all of at least one of the elements, K, Ti and P is substituted with one or more other elements and a process for the production thereof.

Another object of the present invention is to provide the solid solution crystals mentioned above having a homogeneous composition and a large size, which can make it possible to provide devices having a uniform composition and constant physical properties with a high yield and a process for the production thereof.

In the production method of the present invention, when the pulling up direction of crystal is along the Z axis, the major growing face is the center [201] face and [011] faces located on its both ends. If it is possible to obtain a large [201] growing sector area constituted by the major growing face, it becomes possible to improve the total yield. However, growth of [011] cannot be ignored in practical operation and they compete in the growing process with each other. Therefore, it is difficult to get a large single sector area.

Thus, an additional object of the present invention is to provide a process for the production of single crystals where it is possible to obtain a large [201] growing area to improve the total yield.

In order to produce single crystals with good quality by crystal growth from a solution, it is generally necessary to control the growth rate. Therefore, growth of long period is required for the production of single crystals of a large size and, as a result, it leads to a problem of high production cost.

To solve this problem, it is expected that several single crystals are simultaneously grown in a relatively large crucible. However, according to the present inventor's investigation, single crystal growth of preliminarily calculated weight was not obtained by traditional slow cooling technique using several seed crystals.

Therefore, another object of the present invention is to provide a process for the production of single crystals utilizing crystal growth from a solution wherein a plurality of single crystals are grown simultaneously to produce large single crystals with good quality at a low cost.

SUMMARY OF THE INVENTION

According to the present invention, there are provided processes for the production of solid solution single crystal (s) of $KTiOPO_4$ wherein a part or all of at least one of the elements, K, Ti and P is substituted with one or more other elements, which comprises moving a grown part(s) of crystal(s) to outside of a melt for the crystal growth while maintaining contact of a growing part(s) of the crystal(s) with said melt to obtain said solid solution single crystals, wherein the moving is carried out while maintaining the temperature of the melt substantially constant and maintaining said melt at a substantially constant composition at which the solid solution single crystal(s) with the desired composition is precipitated at the above maintained temperature.

According to the present invention, there are further provided solid solution single crystals of $KTiOPO_4$ wherein a part or all of at least one of their elements, K, Ti and P is substituted with one or more other elements and their composition is substantially homogeneous within their cubic portions with a side length of 1 cm.

DETAILED DESCRIPTION OF THE INVENTION

The present invention will be further explained hereinafter.

According to the present invention, solid solutions of interest are those of $KTiOPO_4$ wherein a part or all of at least one of their elements, K, Ti and P is substituted with one or more other elements.

Such solid solutions may be represented by, for example, the formulae of $K_{1-x}A_xTi_{1-y}B_yOP_{1-z}C_zO_4$ or $K_{1-x}D_xTi_{1-x}OP_{1-z}C_zO_4$. Nature and amount of the substituted elements are not particularly limited so long as the crystalline structure of KTP is maintained.

As the element A, which can substitute for K (potassium), there can be mentioned, but not limited to, Rb, Cs, Tl, Na and the like. Amount of substitution (x) may vary depending on the nature of the elements and, for example, it may be (x=) 0 to 1 for Rb, 0 to 0.6 for Cs, 0 to 0.5 for Tl and 0 to 0.4 for Na.

As the element B, which can substitute for Ti (titanium), there can be mentioned, but not limited to, Sn, Al and the like. Amount of substitution (y) may be vary depending on the nature of the elements and, for example, it may be (y=) 0 to 0.5 for Sn and 0 to 0.1 for Al.

As the element C, which can substitute for P (phosphorus), there can be mentioned, but not limited to, As and the like. Amount of substitution (z) may be vary depending on the nature of the elements and, for example, it may be (z=) 0 to 1 for As.

As the element D, which can substitute for K (potassium) and Ti (titanium), there can be mentioned, but not limited to, Nb, Ta and the like. Amount of substitution (x) may be vary depending on the nature of the elements and, for example, it may be (x=) 0 to 0.5 for Nb and 0 to 0.5 for Ta.

Figure 1:
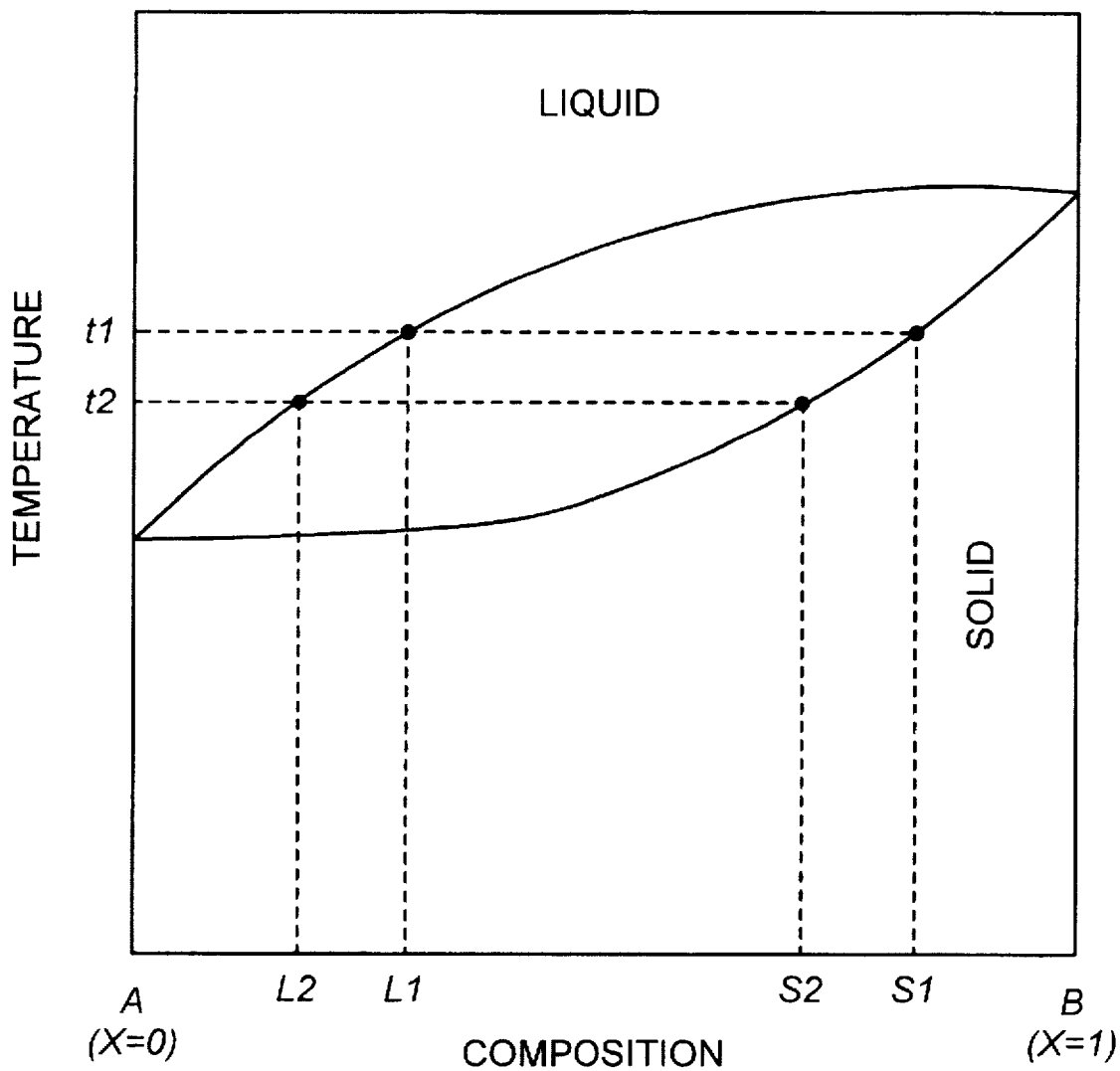
FIG. 1 is a phase diagram of solid solutions.

The melt for the growth of solid solution type crystals should have a composition (liquid phase composition) to grow crystals of a desired composition (solid phase composition) at a temperature set for the crystallization. Solid solutions show, as shown in FIG. 1, a solidus line and a liquidus line and the solid phase composition is different from the liquid phase composition upon crystallization. However, relation between the liquid phase composition and the solid phase composition may be obtained from phase diagrams for certain systems for which phase diagrams are available, or obtained experimentally for the other systems for which phase diagrams are not available.

The composition of the melt for the crystal growth and the temperature to be set for crystallization shall be specifically decided for a specific composition of a target crystal product. The relation between the liquid phase composition and the solid phase composition may be preliminarily determined for a certain temperature and, from such relation, the composition of the melt and the temperature for crystallization of a desired composition shall be decided.

According to the present invention, temperature of the melt is maintained substantially constant. By maintaining the temperature of melt substantially constant, it becomes possible to maintain composition of solid solution single crystals homogeneous. The "temperature of the melt" means a temperature of the melt as a bulk. The "substantially constant temperature" means a temperature within a temperature range which enables to maintain the composition of solid solution crystals substantially homogeneous. Therefore, fluctuation of the composition of solid solution caused by fluctuation of crystallization temperature may be influenced by the composition of the solid solution and hence a range of the substantially constant temperature cannot be definitely defined. However, its fluctuation should generally be within 5° C. at most, preferably 3° C.

Composition of the melt should be held constant for precipitating a target solid solution at a given crystallization temperature. As described above, composition of the melt for crystallizing a target solid solution at a crystal growth temperature as well as temperature shall be specifically decided upon deciding a specific composition of a target solid solution.

The melt composition can be held constant by the addition of solid pieces having a composition substantially identical to that of the grown solid solution crystals to the melt.

In order to obtain crystals with a homogeneous composition, the crystals are preferably grown under a constant and homogeneous temperature while replenishing the melt with solid pieces having a composition substantially identical to that of the grown solid solution crystals so as to keep the volume of the melt and the position of melt surface constant.

The solid pieces for the replenishment preferably have a specific gravity larger than that of the melt, since the crystal growth occurs near the surface of the melt. As such solid pieces having a large specific gravity, there can be mentioned crystalline sintered bodies and granular crystals having a small void ratio. Further, considering dissolution rate in the melt, the solid pieces preferably has a diameter of about 1 cm or less, but have a size enough not to stay at the surface of the melt by surface tension.

The granular crystals mentioned above can be produced by slowly cooling a melt having a given flux composition to precipitate crystals so that the separated crystals should have an average composition substantially identical to that of the grown crystals of the solid solution.

Further, the sintered bodies may be produced by mixing necessary agents so that a resulting mixture should have a composition substantially identical to that of the grown crystals of the solid solution, filling the mixture into a rubber tube, pressing it under a static pressure of 700 to 800 kg/cm² to obtain a rod-like molded product and heating the product in a vertical electric furnace under an oxygen atmosphere, for example, at 850° to 900° C. for 12 hours, to be sintered.

The melt for solid solution crystallization means the flux corresponding to the liquid phase composition mentioned above. It is preferred that a self-flux utilizing, for example, $K_2O$, $TiO_2$ and $P_2O_5$ is used as the flux in terms of avoidance of uptake of impurities into crystals. However, fluxes generally used for the production of KTP such as tungsten oxide, potassium fluoride and molybdenum oxide may also be used for the present invention.

Crystals of the solid solution can be grown by moving a grown part of a crystal to the outside of the melt for crystal growth while maintaining contact of a growing part of the crystal with the melt.

A seed crystal is used for the crystal growth. Crystal grown (i.e. a grown part of crystal) at the surfaces of the seed crystal contacted with the melt is moved together with the seed crystal to the outside of the melt. The transfer of the grown crystal to the outside of the melt may be performed, for example, by pulling up a shaft on which the seed crystal has been fixed.

Direction of the seed crystal is not particularly limited, and it may be decided in view of growth rate of the crystal and selecting a direction along which crystal is grown uniformly. However, with respect to a crystal having a composition quite similar to KTP, it is preferably selected so that Z axis of the seed crystal should be perpendicular to the surface of the melt in terms of obtaining high crystal growth rate and uniform growth.

Shape and size of the seed crystals are also not particularly limited. However, they preferably have a shape spreading in a plane parallel with the surface of the melt and a size smaller than or equal to the diameter of a crucible to be used. This is because such a shape and a size may enhance stirring effect of the melt.

Figure 5:
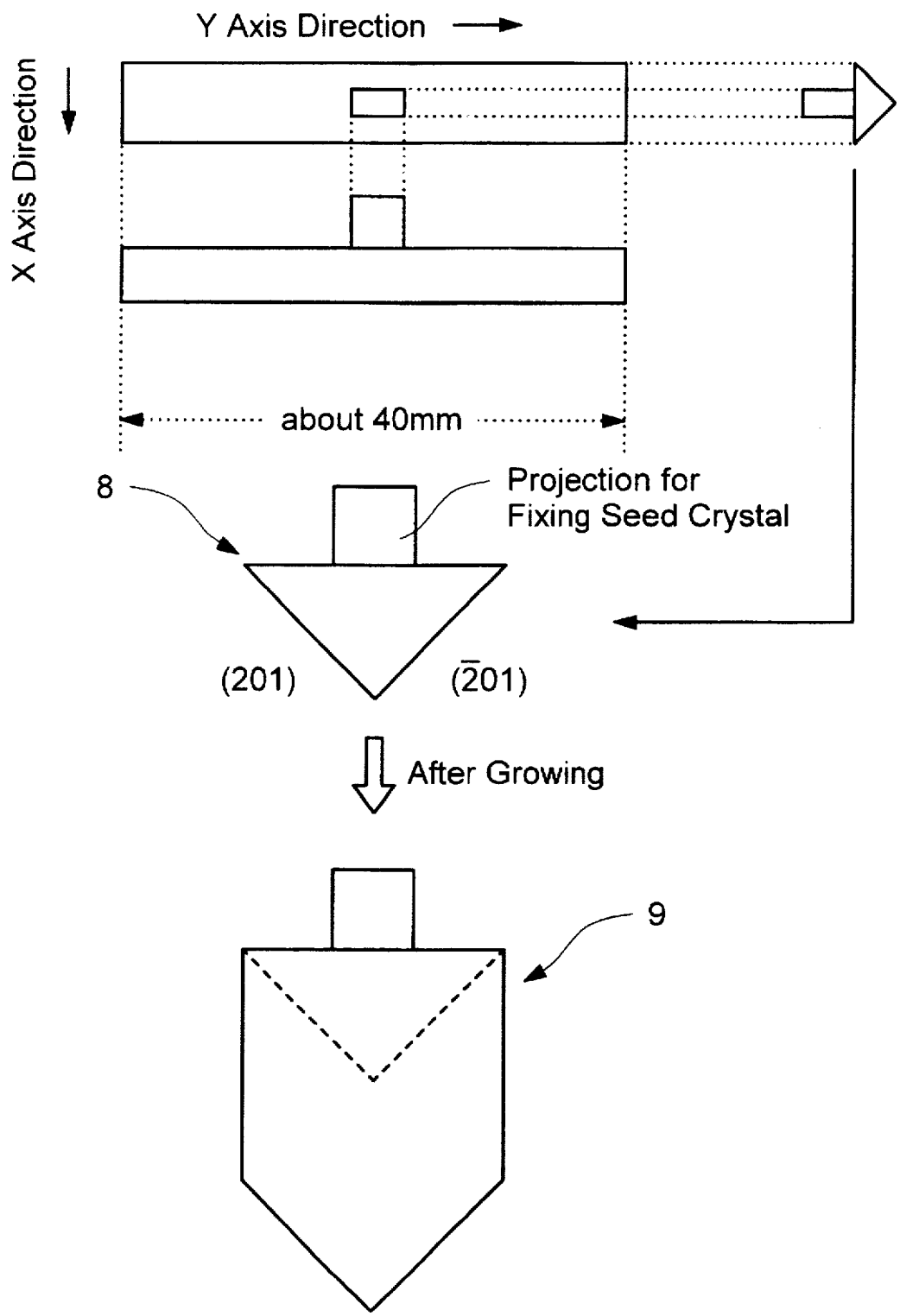
FIG. 5 is a schematic view of a single crystal which can be used for the present invention.

As the seed crystal, a crystal with a wedge-shape cut faces consisting of two faces parallel with the [201] face and the [$\bar{2}$01] face respectively may be used. It is also possible to use a crystal having a length along the Y axis direction substantially identical to a maximum length of a final single crystal to be produced as the seed crystal. Such a seed crystal is shown in FIG. 5. Seed crystal 8 shown in FIG. 5 has a wedge-shape cut faces consisting of two faces parallel with the [201] face and the [$\bar{2}$01] face respectively, and a length along the Y axis direction substantially identical to a maximum length of final single crystal to be produced. By using seed crystal 8 having such characteristics, single crystal 9 substantially composed only of [201] sector can be obtained.

In such a case, pulling-up direction of crystal should be along the Z axis. When a usual seed crystal is used and the pulling-up direction of crystal is along the Z axis, the major growing face consists of the center [201] face and the [011] faces positioned at its both ends.

However, use of a seed crystal having the characteristics described above would afford only a large [201] growing sector consisting of the major growing face. As a result, it can be made possible to improve the total yield.

The competitive face of the [201] face, [011], is formed and developed on a relatively smaller seed crystal during a shoulder-forming process. Therefore, if this process can eliminated from a whole crystallization process, it becomes possible to suppress the development of the [011] sector. According to the present invention, the development of the [011] sector may be suppressed by using a seed crystal having a length along the Y axis direction substantially identical to a maximum length of final single crystal to be produced.

The maximum length of final single crystal to be produced along the Y axis is referred to as a length upon finish of the shoulder-forming, and it may vary depending on the nature of the seed crystal, growth conditions of crystal and the like. Therefore, once the conditions are decided, the maximum length of final single crystal to be produced along the Y axis may be preliminarily obtained by experiments. In Examples described hereinafter, it was about 40 mm.

According to the present invention, the pulling-up may be started after the bottom surface of the seed crystal is shaped to have a wedge-like shape parallel to the [201] face and directly conditioned with the melt so that a single crystal composed only of a [201] sector can be obtained.

By making the [201] sector large as a single sector area, it is possible to shorten the growing period and provide crystals with high yield and good quality.

When a seed crystal having a bottom face of wedge-like shape parallel to the [201] face is used, it is preferred that the temperature at which crystal is grown is preliminarily determined by dipping another seed crystal, since such a seed crystal may show crystallization at a temperature different from that at which a seed crystal having a flat bottom face shows crystallization.

The growth of a target single crystal may be started by immersing a seed crystal in a melt near its surface, permitting the growth for a certain period by the slow cooling technique (in a composition different from a target composition) so that the crystal can grow and extend in a direction parallel to the melt surface (shoulder-forming process) and then keeping the temperature of the melt constant to allow the growth of a solid solution single crystal with a target composition.

When a seed crystal extended in a certain extent is used, or a seed crystal has been extended in a certain extent prior to the crystal growth at a constant temperature, the extended crystal may facilitate stirring of the melt in a crucible, dissolution of starting materials and crystal growth.

The composition of the seed crystal is not necessarily required to be the same as the crystal to be grown and hence, for example, a KTP single crystal may be employed.

Figure 2:
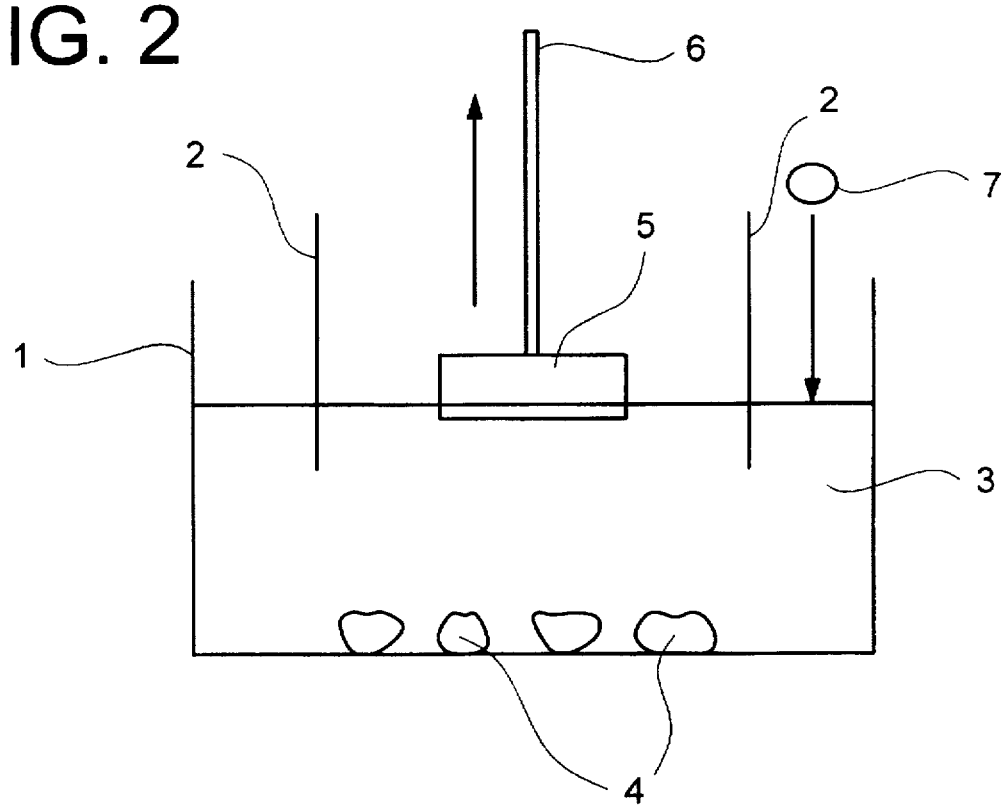
FIG. 2 is a diagram for illustrating the process for the production of single crystals according to the present invention.

The production process of the present invention may be carried out by using, for example, the apparatus of which cross-sectional view is shown in FIG. 2. Crucible 1 having partition wall 2 contains melt 3 and feed crystals 4. Crucible 1 is placed in an electric furnace not shown. A bottom portion of seed crystal 5 is contacted with the surface of melt 3. Seed crystal 5 is rotated at a constant revolution rate and pulled up at a constant speed by pulling-up bar 6. As the crystal growth proceeds, replenisher crystal 7 is added to melt 3 at a place separated from seed crystal 5 by partition wall 2.

The process of the present invention will be further explained by referring to FIG. 2.

The seed crystal is immersed in the melt, which is maintained at a temperature immediately below the liquidus line ($\Delta T<1°$ C.), near its surface and left for a certain period. The seed crystal has been preliminarily grown along the Y axis, i.e., parallel to the liquid surface (and, if possible, it preferably has a size near the diameter of the crucible). The Z axis is along the direction perpendicular to the liquid surface. By giving a small $\Delta T$, the seed crystal is grown and growth of natural face is accelerated. In this step, the system is adjusted so that the seed crystal can be conditioned with the melt and saturation can be realized throughout the melt at the temperature maintained. While maintaining such conditions, the system is left for about four to five days. After the melt and the whole seed crystal have been almost reach an equilibrium, the equilibrium is gradually sifted to grow the crystal. Solute amount in the melt reduced as a result of the crystal growth is supplemented from the outside and the same growth environment (temperature) is maintained.

It is appropriate that the crystal growth is performed by gradually pulling up the seed crystal while it is rotated. As the crystal grows and is pulled up, the position of the solid-liquid interface moves. At the same time, the crystal growth conditions are hold by the addition of replenisher solid pieces and the maintenance of a constant temperature. Because of this, the system tends to return to a solid-liquid interface in an equilibrium and hence crystal growth is promoted. In this step, the pulling up speed is adjusted to a range of 0.1 to 5 mm/day, preferably 0.5 to 1.5 mm/day, considering the quite slow growth rate.

During the pulling-up of the crystal, replenishment of the solid pieces is repeated with a constant interval in a portion of, for example, about 5 to 10 g (per the growth of a single crystal) to deposit it at the bottom of the crucible. Further, it is preferred that a seed crystal having a large face parallel to the melt surface is rotated at a high speed such as 100 to 200 rpm so that the melt can be stirred and homogenized. By such an operation, the replenished solid pieces are easily dissolved and reached to the growing interface of the crystal.

By carrying out the process as described above, the temperature fluctuation ($\Delta T$) of the melt in the crucible is normally maintained within 2° C. With respect to KTP solid solution single crystals, it is difficult to grow crystals having a uniform composition with a steep temperature gradient ($\Delta T>5°$ C.). As shown in FIG. 2, the conventional temperature difference technique ($\Delta T=10°$ to 135° C.) and the double-crucible technique are not suitable for growing homogeneous KTP solid solution single crystals because of their too steep temperature gradients of the solution in the crucible, even though they can theoretically be used as a constant temperature growing method.

The crystal is grown by pulling up while keeping the conditions described above, and, after pulling-up of an appropriate length (20 to 50 mm), the grown single crystal is recovered.

To recover a grown crystal, the crystal is forced to remove from the melt surface (the portion immersed in the melt is pulled up) or the crystal is waited to spontaneously remove from the melt surface. Then, the crystal is cooled to a room temperature at a cooling rate of 20° to 40° C./hour and removed from the furnace.

In the production method of the present invention, two or more crystals may be grown in parallel while stirring the melt with a stirrer. This embodiment will be explained by referring to FIG. 6.

Figure 6:
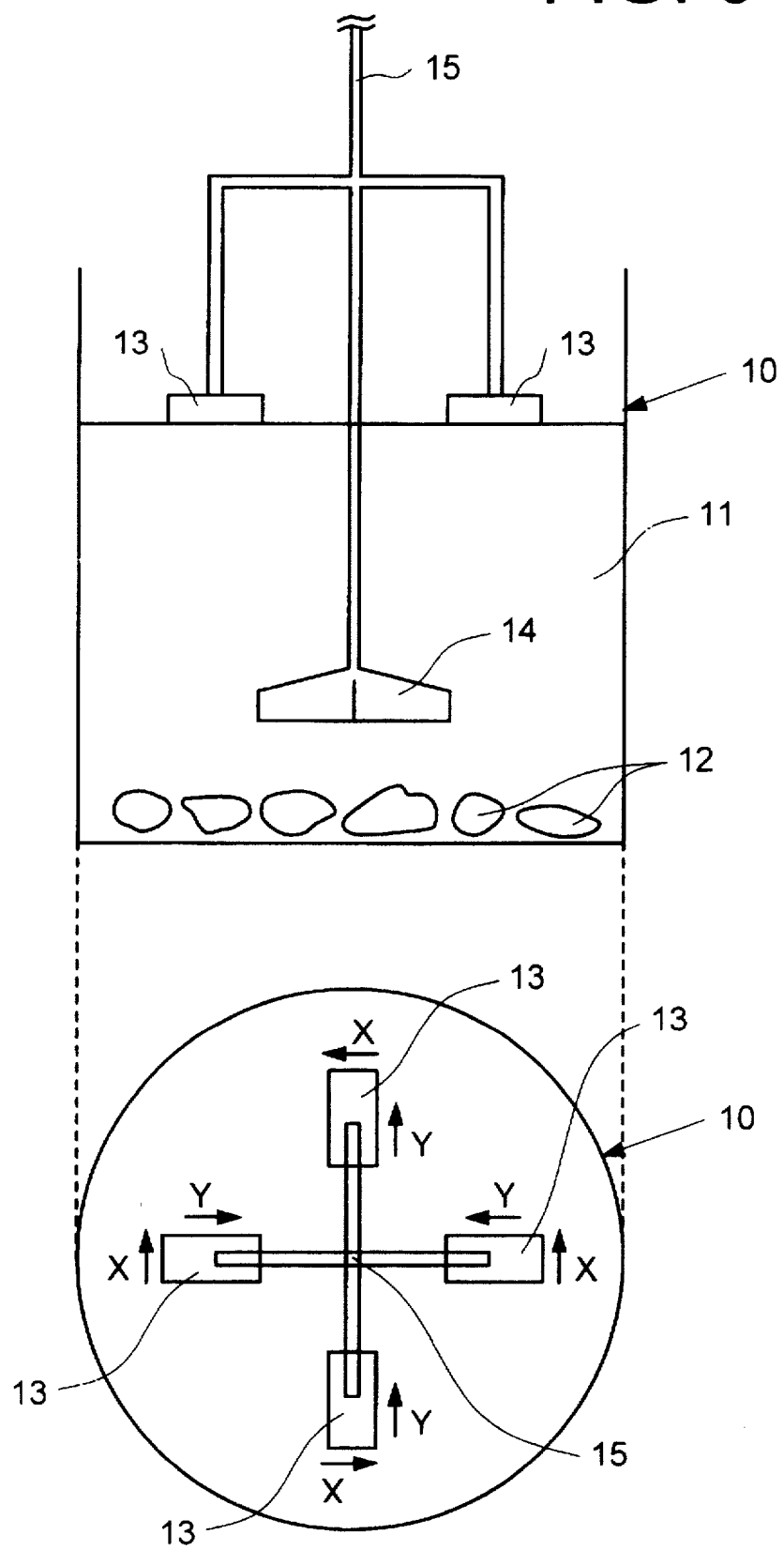
FIG. 6 is a diagram for explaining the production process of the present invention where a plurality of single crystals are grown simultaneously.

The top of FIG. 6 is a side view of a crucible and the bottom of FIG. 6 is a plane view of the crucible from its top. In this figure, crucible 10 contains melt 11 and feed crystals 12. Crucible 10 is placed in an electric furnace not shown. Several seed crystals 13 are fixed on each branch of pulling-up bar 15 provided with stirring blade 14, rotated and pulled up at constant speeds. The seed crystals are arranged so that their Y axes should be in parallel with a radial direction of the crucible as shown in the bottom of FIG. 6. Such an arrangement is employed to make the crystals grow in the Y axis direction so that stirring effect by the crystals themselves can be exerted effectively. In addition, as the crystals grow, feed crystals are replenished to the melt.

Number of the seed crystals and size of the crucible used for the crystal growth may optionally be selected. The stirring blade may be an independent means separated from the pulling-up bar. Stirring conditions may be suitably selected so that the solute in the melt can be sufficiently supplied to the surfaces of the growing crystals. According to the present inventor's investigation, when a plurality of single crystals were grown simultaneously in a large crucible without stirring, single crystal growth of preliminarily calculated weight was not obtained. This may be considered to be caused by the heterogeneity of the components contained in the melt or the presence of transport process for the solute essential for the crystal growth unlike the crystal growth from a pure melt. To solve these problem, the process of the present invention employs the arrangement of the seed crystals and the stirring blade described above.

Conditions other than those described above may be the same as those mentioned in the explanation as to FIG. 2.

By placing the seed crystals so that their axes should be in the direction of the Z axis, i.e., the pulling-up direction should be along the Z axis, crystal growth is realized preferentially on the [011] face or the [201] face. This makes possible to grow large crystals composed of a grown sector resulted from the growth of either of the faces. In a single crystal composed of a single growth sector, solid-liquid impurity distribution coefficient, which may fluctuate in every sector, would not be present, and hence homogeneous crystals can be obtained. Further, growth sector interfaces, which constitute a major cause of heterogeneous refractive index, may be reduced to a maximum possible extent and thus single crystals composed of homogeneous single growth sector containing no growth sector interface can be obtained.

In particular, by utilizing seed crystals having the bottom face of wedge-shape mentioned above, single crystals composed of a single [201] growth sector can be obtained.

Further, in the production method of the present invention, because the crystal growth temperature is always maintained constant, variations of impurity concentration, defect distribution and crystal composition in the single crystals caused by the temperature fluctuation can be avoided.

According to the production process of the present invention, because crystals are grown with no temperature fluctuation while consumed starting material is supplemented continuously, homogeneous solid solution KTP single crystals showing no fluctuation of composition (amount of doped impurities) can be obtained.

In the single crystals of the present invention, size in the direction of crystal growth (usually the moving direction of crystal perpendicular to the melt surface) may be optionally selected by controlling the growth conditions, growth period (day) and the like. For example, they may have a length of several cm in the direction mentioned above. Size of the plane perpendicular to the growth direction may be suitably adjusted by selecting the size of the seed crystals.

The single crystals of the present invention are characterized in that they have a substantially homogeneous composition within their cubic portions having a side length of 1 cm. In particular, their composition in the direction of the crystal growth is substantially constant within a length of 1 cm.

In conventional crystal growth, since a plurality of crystal faces are grown simultaneously and, in addition, growth conditions may be changed as the growth proceeds, heterogeneity is normally observed in the crystals due to the fluctuation of composition or the growth sector interfaces.

In contrast, in the process for the production of single crystals according to the present invention, a single crystal face is preferentially grown in the center of the growth face. This face is referred to as preferential growth face and corresponds to the area surrounded by the broken line in the crystal shown in FIG. 3. Further, in a plane (the preferential growth facet is included in this plane) perpendicular to the direction of crystal growth (pulling-up direction of crystal), crystal is grown in substantially the same conditions at any stage of the process. Therefore, the single crystals of the present invention resulted from the growth of the preferential growth facet have a substantially homogeneous composition within a range of at least 1 cm from any point in the crystals. The present inventor has experimentally confirmed that single crystals having a length of about 3 cm and a substantially homogeneous composition can be obtained.

The expression "substantially the same composition" herein means that fluctuation in composition of the single crystals does not affect on their physical properties.

EXAMPLES

The present invention will be further explained in more detail by the following examples and reference example.

Reference Example

Investigation on relation between liquid phase composition and solid phase composition ① In the case of liquid phase Na/K=0.1

Prepared was a melt for crystallization of $K_{1-x}Na_xTiOPO_4$ (x=0.091) where the ratio of Na to K (Na/K) is 0.1.

Starting materials of $KPO_3$, $NaP_3$, $TiO_2$, $K_2CO_3$ and $Na_2CO_3$ were weighed and mixed so that a resulting mixture should have a Na/K of 0.1. Weights of the components were as follows:

$KPO_3$: 121.4999 g
$NaPO_3$: 11.6579 g
$TiO_2$: 27.4266 g
$K_2CO_3$: 24.8764 g
$Na_2CO_3$: 2.1197 g

After sufficiently mixing the components, the mixture was introduced seven times into a platinum crucible (diameter: 100 mm, height: 100 mm, thickness 0.5 mm) preliminarily heated to a temperature around 1000° C. in an electric furnace. The total amount of the introduced mixture was 188.6308×7=1320.4156 g.

After introducing the mixture into the crucible, the crucible was placed at a predetermined position in a crystal growth furnace. The crucible was heated to 1100° C. and left for 24 hours at that temperature to homogenize the content. Then, the temperature was lowered to 950° C. and the crucible was maintained at that temperature for a certain period. A seed crystal fixed at a tip of a fine alumina tube was immersed into a melt at its surface and cooled at a rate of 5° C./hour to about 890° C. Then, slow cooling at a rate of 1° C./day was started.

About one week after the start of the slow cooling, a single crystal of about 10×15×10 mm was grown and it was removed. The slow cooling was continued as to the remained melt to further continue crystal growth on the bottom or the wall of the crucible for three weeks. After the slow cooling was finished, the crucible was quenched and removed to the outside of the furnace to cool it to room temperature. Flux in the crucible was washed with water and remained microcrystals were collected. The total weight of the microcrystals was about 220 g.

Chemical composition of a portion of the single crystal previously removed having a composition as approximate to that obtained at the start of the crystal growth as possible, i.e., a portion as approximate to the seed crystal as possible (primary crystal) was analyzed to investigate the difference in composition between the solution (melt) composition and the solid solution (primary crystal) composition. As a result, it was found that the melt had a Na/K ratio of 0.1 while the primary crystal had a Na/K of 0.06.

As a result of a similar chemical analysis of the remained microcrystals where they were ground and mixed, it was found that the microcrystals had a Na/K ratio of about 0.08.

② In the case of liquid phase Na/K=0.14

The same experiment as the above ① was repeated except that the mixing ratio of the starting materials was controlled so that the Na/K ratio of the melt should be 0.14. As a result, primary crystal showed a Na/K ratio of 0.08. The remained microcrystals showed a Na/K ratio of 0.12.

From the results of the above ① and ②, was found that a solid solution single crystal $K_{1-x}Na_xTiOPO_4$ (x=0.057) having a Na/K ratio of 0.06 can be produced by using a melt having a Na/K ratio of 0.10 and replenisher crystals having a Na/K ratio of 0.06 and carrying out the crystal growth under a constant temperature, not by the slow cooling technique. Further, it was found that a solid solution single crystal $K_{1-x}Na_xTiOPO_4$ (x=0.074) having a Na/K ratio of 0.08 can be produced by using a melt having a Na/K ratio of 0.14 and replenisher crystals having a Na/K ratio of 0.08.

Therefore, in the following Example 1, it was tried to produce a solid solution single crystal $K_{1-x}Na_xTiOPO_4$ (x=0.074) having a Na/K ratio of 0.08 by using a melt having a Na/K ratio of 0.14 and the crystals collected in the above ① as the remained microcrystals having a Na/K ratio of 0.08 as the replenisher crystals.

Example 1
Experiment of Growing a Solid Solution Single Crystal $K_{1-x}Na_xTiOPO_4$ (x=0.074)

Starting materials (reagents used were the same as those used in Reference Example) weighed so that a resulting melt should have a Na/K of 0.14 were mixed and introduced into a platinum crucible (diameter: 100 mm, height: 100 mm, thickness 0.5 mm) at 1000° C. in an amount of about 80% of the crucible volume.

Then, the crucible was placed at a predetermined position in a crystal growth furnace (provided with a SiC resistor and pulling-up and rotation drive). Temperature of the furnace was brought to about 1100° C. and maintained at that temperature for about 24 hours to homogenize the melt components. Then, the furnace temperature was lowered to 920° C. at a rate of 50° C./hour and maintained at that temperature for a certain period. As a seed crystal, a KTP single crystal, which had developed natural faces of [011] and [201] faces, lengths of 35 mm along the Y axis direction and 10 mm along the X axis direction and a maximum thickness of 10 mm in the Y axis direction, had been preliminarily provided. This seed crystal was fixed at a tip of an alumina shaft for fixing with a platinum wire so that the longitudinal direction of the shaft should be parallel to the Z axis direction.

The seed crystal was immersed into the above melt maintained at 920° C. and cooled at a rate of 10° C./hour while carefully monitoring it. The cooling was once interrupted at 890° C. and the crystal was examined. As a result, crystal growth was observed around the seed crystal and therefore the seed crystal was maintained at the same temperature. After about one week, pulling-up of the crystal was started. In this step, the rotation speed of the crystal was 100 to 150 rpm such that the inside of the crucible should be forced to be stirred and homogeneous environment for the crystal growth should be realized. The pulling-up speed was 1 mm/day.

While the crystal was pulled up, addition of crystals for replenishment was started. The replenisher crystals were added after they had been heated to a temperature near that of the melt so that the melt should not be cooled by the added crystals to precipitate undesired crystals. The crystals were added every about 3 days in an amount of 7 g to deposit them at the bottom of the crucible.

Figure 3:
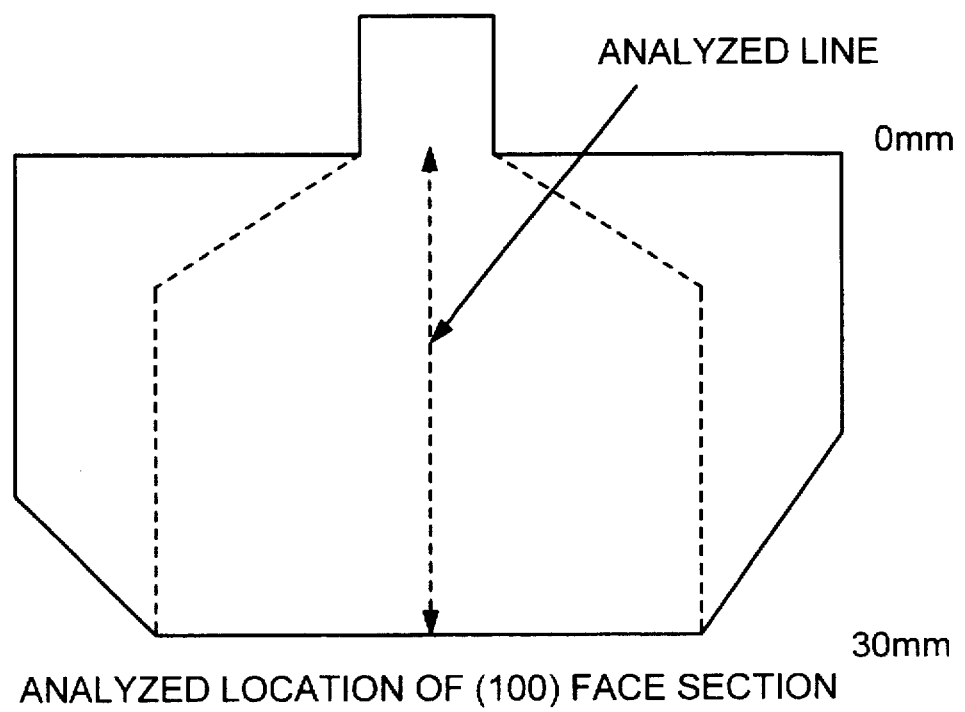
FIG. 3 is a diagram for illustrating the analyzed position of the single crystal in Example 1.

Pulling-up of the crystal was carried out for 40 days. The total amount of the replenisher crystals added during that period was about 80 g. As a result, a solid solution single crystal of a rectangular solid shape having a size of 40 mm in the Y axis direction, 20 mm in the X axis direction and 40 mm in the Z axis direction could be produced (the cross-sectional face shown in FIG. 3 is perpendicular to the X axis and the horizontal direction is along the Y axis and the vertical direction along the Z axis in the cross-section in FIG. 3). The total weight of this crystal was about 75 g.

Evaluation of the Single Crystal
Homogeneity in composition of the solid solution single crystal obtained above was evaluated as follows.

The obtained single crystal was cut in a plane passing its center and parallel to the [100] face to form a test plate for analysis (See FIG. 3). The plate consisted of the center large [201] sector and [011] sectors at the both ends. Analysis was mainly focused on the [201] sector. For analysis, line analysis was performed along the Z axis by means of an EPMA (analysis was focused on the center of the sector).

Figure 4:
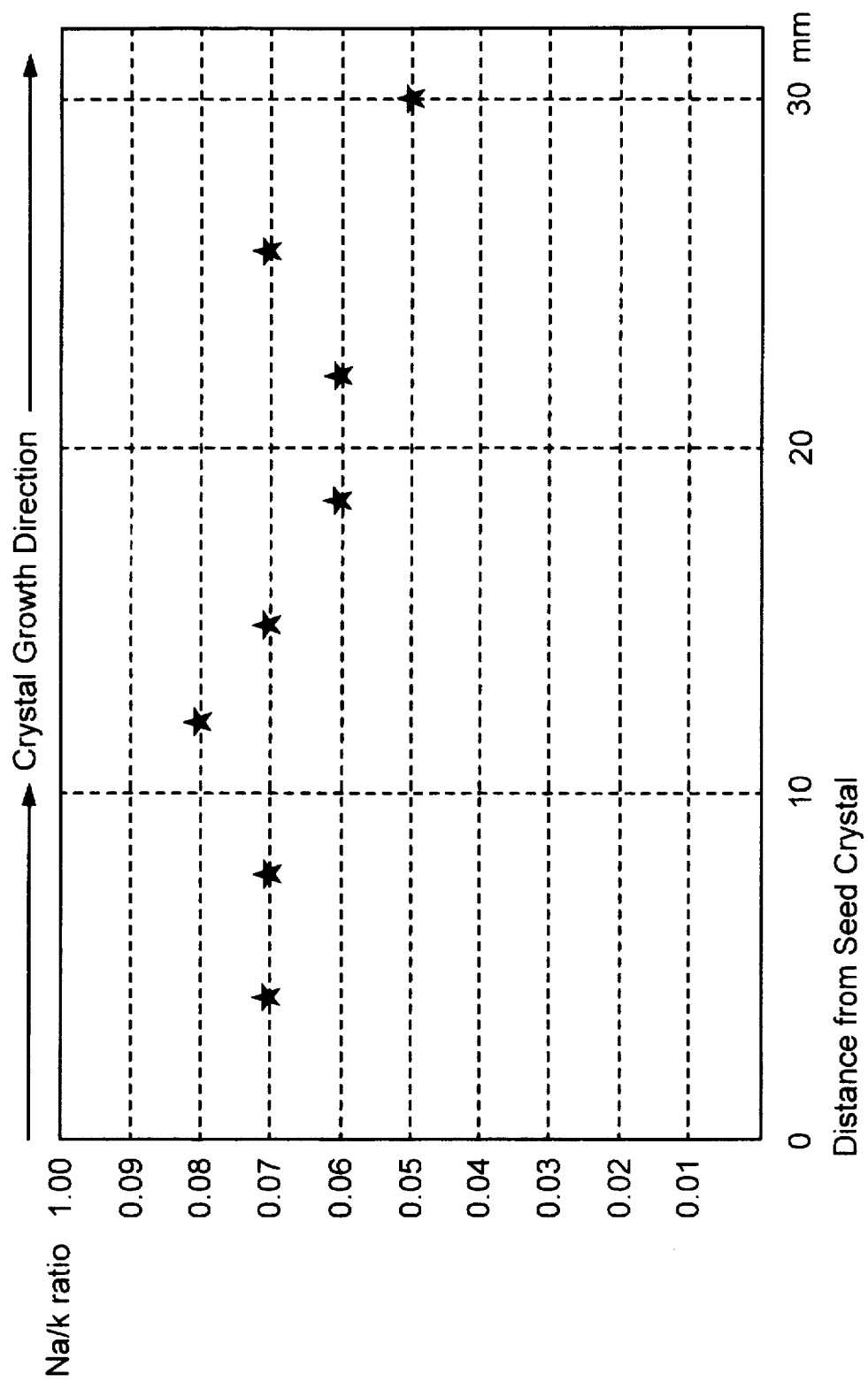
FIG. 4 is a diagram showing the results of analysis with respect to Na/K ratio of the single crystal in Example 1.

Na/K ratios obtained by the line analysis with the EPMA are shown in FIG. 4.

In the results of FIG. 4, it is seen that, from the start to the end of the crystal growth, the Na/K ratio varied from 0.0.6 to 0.08 and substantially uniform Na substitution was obtained.

Example 2

A KTP single crystal homogeneously doped with $Al^{3+}$ was produced in such an apparatus as shown in FIG. 6. Potassium metaphosphate ($KPO_3$, 134.99 g), titanium oxide ($TiO_2$, 27.43 g), potassium carbonate ($K_2CO_3$, 27.64 g) and aluminium oxide ($Al_2O_3$, 2.10 g) were mixed. The mixture was melted by maintaining it at 1000° C. and charged about 50 to 60 times into a platinum crucible having a diameter of 20 cm and a height of 20 cm to fill up 70 to 80% of the crucible volume. To homogenize the starting materials, they were maintained at the same temperature and mixed for 12 to 24 hours. These melting and mixing steps were performed directly in a crystal growth furnace.

Then, the temperature of the melt in the crucible was lowered to 920° to 930° C. to form a saturated melt of KTP. After temperature fluctuation disappeared, preliminarily prepared 500 to 600 g of fine granular crystals (diameter: 5 to 10 mm) of KTP doped with Al were added portionwise into the crucible without changing the temperature of the whole melt and deposited at the bottom of the crucible.

After the crucible was left stand for a certain period, it was confirmed that any floating microcrystals such as those of undesired crystals were not observed on the surface of the melt (when microcrystals were floated, they were forced to be sedimented with a pre-heated platinum rod, or dissolved by raising temperature to 970° C. for a moment).

Then, a seed crystal shaft 15 set with four seed crystals 13 was approached the surface of the melt 11 to be sufficiently pre-heated and then a stirring screw 14 was immersed in the melt. Thereafter, the seed crystals were brought into contact with the surface of the melt, while confirming that the screw 14 was not in contact with the deposited starting material crystals 12.

Slow cooling was performed according to a temperature program initially started from a relatively high temperature with a cooling rate of 1° to 5° C./day to obtain shoulder-forming growth of the crystal. This step took about 10 to 15 days.

After the shoulder-forming was completed and a length of about 40 to 50 mm (Y axis) was obtained, temperature decrease was stopped. Then, pulling-up of the crystal was started at a rotation speed of the seed crystal shaft of 100 to 150 rpm while temperature was maintained constant. The pulling-up speed was 1 mm/day.

While keeping the conditions described above, the pulling-up was continued for 40 days. During this period, about 10 g of preheated starting material crystals were added to the melt every 24 hours.

After about 40 days, the pulled up crystals were removed from the melt, slowly cooled to room temperature for 2 days and taken out from the furnace. Four single crystals having such a shape as shown in FIG. 3 were simultaneously obtained in the same shape and the same size (70 to 80 g). All of them had a homogeneous composition.

Example 3

Crystal growth was performed in a manner similar to that of Example 2 except that seed crystals processed so that it can have a wedge-shape having a length along the Y axis of about 40 mm and a bottom face parallel to the [$\overline{2}01$] and [201] faces (the length along the X axis is about 8 mm and the length to the top of wedge along the Z axis is about 6 mm).

With respect to the seeding, while the procedure employed was almost the same as the previous experiment, the temperature at which crystal starts to grow had been preliminarily determined by using another small seed crystal. The temperature at which crystal starts to grow was 920° to 925° C. The processed seed crystals were preheated to the predetermined temperature, brought into contact with the surface of the melt and maintained at that temperature for certain period (for 4 to 6 days), and then pulling-up was started. Thereafter, completely the same procedure as Example 2 was repeated and 30 days after four single crystals (length along the X axis of about 20 mm, length along the Y axis of about 40 mm, length to the top of wedge along the z axis of about 40 mm and weight of about 80 g) were successfully obtained. At the ends of the obtained crystals, development of [011] face was observed.

By using seed crystals having such a shape as shown in FIG. 5, crystals having the same size as that of Example 2 could be obtained in a short grown period of about 10 days and the yield of the single sector zone could be also improved by about 20 to 30%.

According to the present invention, there can be provided solid solution single crystals of KTiOPO$_4$ wherein a part or all of at least one of the elements, K, Ti and P is substituted with one or more other elements and their compositions are substantially homogeneous as well as processes for the production thereof.

According to the present invention, there can further be provided solid solution crystals having a homogeneous composition and a large size, which enable to produce devices having a homogeneous composition and stable physical properties with a high yield, and processes for the production thereof. According to the present invention, characteristics of KTP can be varied based on material design and hence uses of KTP bulk crystals can be extremely increased.

Furthermore, according to the present invention, there can be provided processes for the production of single crystals, which enables to ensure a large [201] growing sector area and hence enables to improve the total yield.

In addition, according to the present invention, there can still further be provide processes for the production of single crystals utilizing crystal growth from a melt wherein a plurality of single crystals are grown simultaneously to produce large single crystals with good quality at a low cost.

What is claimed is:

1. A process for the production of solid solution single crystal(s) of KTiOPO$_4$ wherein a part or all of at least one of the elements, K, Ti and P is substituted with one or more other elements, which comprises moving a grown part(s) of crystal(s) to outside of a melt for the crystal growth while maintaining contact of a growing part(s) of the crystal(s) with said melt to obtain the above solid solution single crystals, wherein the moving is carried out while maintaining the temperature of the melt substantially constant and maintaining said melt at a substantially constant composition at which the solid solution single crystal(s) with the desired composition is precipitated at the above maintained temperature.

2. The process of claim 1 wherein the crystal growth is performed while a solid piece(s) having substantially the same composition as that of a crystal(s) to be grown is added to the melt, and an additional piece(s) is replenished to the melt during the growth so as to keep the volume of the melt constant.

3. The process of claim 1 wherein the crystal growth is carried out while the composition and temperature of the melt are maintained constant by rotating the growing crystal (s) to stir the melt.

4. The process of claim 1 wherein the melt comprises components and a flux, wherein the components have a composition capable of precipitating a target solid solution at a crystal growth temperature.

5. The process of claim 1 wherein a seed crystal(s) having cut faces of a wedge-shape consisting of two faces parallel to the [201] and [$\overline{2}01$] faces is used.

6. The process of claim 1 wherein a seed crystal(s) having a length along the Y axis substantially identical to the maximum length of a final single crystal product is used.

7. The process of claim 1 wherein two or more crystals are grown simultaneously while stirring the melt with a stirrer.

8. The process of claim 1 wherein the solid solution single crystal(s) is represent by the formulae of

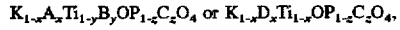

wherein the element A is at least one selected from the group of Rb, Cs, Tl and Na; the value x ranges from 0 to 1 for Rb, 0 to 0.6 for Cs, 0 to 0.5 for Tl and 0 to 0.4 for Na;

the element B is at least one selected from the group of Sn and Al; the value y ranges from 0 to 0.5 for Sn and 0 to 0.1 for Al;

the element C is As and the value z ranges from 0 to 1;

the element D is at least one selected from the group of Nb and Ta; the value x ranges from 0 to 0.5 for Nb and 0 to 0.5 for Ta.

9. A solid solution single crystal of KTiOPO$_4$ wherein a part or all of at least one of the elements, K, Ti and P is substituted with one or more other elements and its composition is substantially homogeneous within its cubic portions of a side length of 1 cm.

10. The solid solution single crystal of claim 9 wherein a part of at least one of the elements, K, Ti and P is substituted with one or more other elements and its composition is substantially homogeneous within a length of 1 cm along its crystal growth direction.

11. The solid solution single crystal of claim 9 wherein the solid solution single crystal is represent by the formulae of

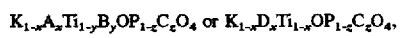

wherein the element A is at least one selected from the group of Rb, Cs, Tl and Na; the value x ranges from 0 to 1 for Rb, 0 to 0.6 for Cs, 0 to 0.5 for Tl and 0 to 0.4 for Na;

the element B is at least one selected from the group of Sn and Al; the value y ranges from 0 to 0.5 for Sn and 0 to 0.1 for Al;

the element C is As and the value z ranges from 0 to 1;

the element D is at least one selected from the group of Nb and Ta; the value x ranges from 0 to 0.5 for Nb and 0 to 0.5 for Ta.

* * * * *